(12) United States Patent
Lane et al.

(10) Patent No.: US 7,262,634 B2
(45) Date of Patent: Aug. 28, 2007

(54) METHODS OF REDUCING POWER IN PROGRAMMABLE LOGIC DEVICES USING LOW VOLTAGE SWING FOR ROUTING SIGNALS

(75) Inventors: Christopher Lane, San Jose, CA (US); Vikram Santurkar, Fremont, CA (US)

(73) Assignee: Altera Corporation, San Jose, CA (US)

(*) Notice: Subject to any disclaimer, the term of this patent is extended or adjusted under 35 U.S.C. 154(b) by 98 days.

(21) Appl. No.: 11/039,272

(22) Filed: Jan. 19, 2005

(65) Prior Publication Data
US 2006/0158220 A1    Jul. 20, 2006

(51) Int. Cl.
*H03K 19/177*    (2006.01)
(52) U.S. Cl. .......................................... 326/41; 326/47
(58) Field of Classification Search ............ 326/37–41, 326/47, 68, 80, 81
See application file for complete search history.

(56) References Cited

U.S. PATENT DOCUMENTS

| | | | | |
|---|---|---|---|---|
| 5,644,255 A | * | 7/1997 | Taylor | 326/81 |
| 5,818,261 A | * | 10/1998 | Perner | 326/86 |
| 5,909,126 A | | 6/1999 | Cliff et al. | |
| 5,963,049 A | | 10/1999 | Cliff et al. | |
| 7,088,140 B1 | * | 8/2006 | Nguyen et al. | 326/81 |

\* cited by examiner

*Primary Examiner*—James H. Cho
(74) *Attorney, Agent, or Firm*—Ropes & Gray, LLP; Robert R. Jackson; Jeffrey C. Aldridge

(57) ABSTRACT

Reduced voltage swing signal path circuitry is provided that lowers the internal signaling power consumption of the interconnection resources of a programmable logic device. The reduced voltage swing signal path circuitry includes a reversed routing driver circuitry to limit the voltage range of the output signal of the driver circuitry.

18 Claims, 7 Drawing Sheets

METHODS OF REDUCING POWER IN PROGRAMMABLE LOGIC DEVICES USING LOW VOLTAGE SWING FOR ROUTING SIGNALS

BACKGROUND OF THE INVENTION

The present invention relates generally to programmable logic devices (PLDs), and more particularly to reducing power consumption in such devices.

It should be noted that the term PLD as used herein is intended to cover the broad space of programmable logic. This includes devices commonly known as CPLDs (Complex Programmable Logic Devices) such as MAX 7000® from Altera Corporation of San Jose, Calif., FPGAs (Field Programmable Gate Arrays) such as Stratix® from Altera, or Structured ASICs (metal programmable logic) such as Hardcopy® from Altera.

Examples of known programmable logic devices are shown in Cliff et al. U.S. Pat. Nos. 5,909,126 and 5,963,049, which are hereby incorporated by reference herein in their entireties. PLDs typically include large numbers of regions of programmable logic and other operational resources such as memory, input/output circuits, etc., that are selectively interconnectable via programmable interconnection resources on the device. For example, each region of programmable logic on a PLD may be programmable to perform any of several relatively simple logic functions on several input signals applied to that region in order to produce one or more output signals indicative of the result of performing the selected logic function(s) on the input signals. The interconnection resources are programmable to convey voltage signals (ranging from a ground voltage $V_{SS}$ (e.g., a "LOW" voltage signal) to a source voltage $V_{CC}$ (e.g., a "HIGH" voltage signal) to, from, and between the logic regions in any of a wide variety of patterns or configurations. For example, the interconnection resources may be used to concatenate several logic regions so that much more complex logic tasks can be performed than any one logic region can perform.

It is typical to use a single conductor for each individual interconnection pathway or path segment in PLDs. Single or multiple MOS pass gates (controlled by programmable memory elements or circuits on the PLD) are used for selectively interconnecting each conductor to other conductors to provide various signal routings through the interconnection resources of the device.

The operation of a typical single-transistor pass gate may be succinctly illustrated by a description of an NMOS pass gate (analogous principles of operation, as understood by one skilled in the art, would apply for a PMOS pass gate). Depending on whether the potential difference between its gate terminal, $V_{GATE}$, and its source terminal, $V_{SOURCE}$, exceeds the threshold voltage, $V_T$, an NMOS pass gate acts as an "open" or a "closed" switch. (As is well-known in the art, there is no physical difference between the "source" and "drain" terminals of a MOS device.) When $V_{GATE}-V_{SOURCE}$ is less than $V_T$, the NMOS pass gate is in the "cutoff" state, thereby acting as an "open" switch; when $V_{GATE}-V_{SOURCE}$ is greater than $V_T$, the NMOS pass gate is in the conduction state, thereby acting as a "closed" switch.

As is well-known in the art, $V_T$ is not a discrete value for a MOS transistor; it may be considered a range of values that is influenced by a variety of second-order effects, such as substrate bias and subthreshold conduction. However, in order to simplify the illustration of the principles of the present invention, $V_T$ will be discussed herein as if it is a discrete value rather than a range of values.

With the current trend in scaling down device geometries (e.g., 0.18 μm process down to 0.13 μm, 90 nm, 65 nm, or lower) and the consequent use of ever-lower operating voltages (e.g., supply voltages, bias voltages, etc.), which are nearing levels comparable to $V_T$, the ability of transistor pass gate structures to function at relatively high speeds while at the same time minimizing leakage current is a difficult design hurdle to overcome.

Moreover, this trend of smaller device geometries and consequent use of lower operating voltages is creating a design tradeoff between speed (e.g., response time for the pass gate transistor to turn ON) and leakage current (e.g., the current that passes through the pass gate transistor when turned OFF) that was not previously experienced with larger device geometries and the consequent use of higher operating voltages. That is, if conventional design techniques are applied to smaller device geometries, high speed pass gate operation is accompanied with high leakage current, whereas low leakage current is accompanied with low speed pass gate operation. High leakage current is undesirable because it results in excess heat, power loss, and poorer performance.

Another problem associated with shrinking geometries is the consequent use of lower operating voltages. This lower operating voltage is typically a nominal voltage supplied to the device, and may be insufficient for certain circuitry, such as configurable memory cells (e.g., SRAM) within the device, to operate properly. For example, as the supply voltage decreases, the soft-error-rate increases because the critical charge needed to flip the cells (from one logic state to another) is reduced.

A large percentage of a device's power is consumed by the capacitive charging and discharging of the interconnection conductors. At lower operating voltages, the $V_T$ drop of NMOS pass gates becomes a more significant fraction or percentage of the operating voltage. This can lead to several problems in conventional PLD interconnection circuitry. For example, signaling slows down and the circuitry becomes increasingly susceptible to capacitive cross-talk between parallel conductors.

Accordingly, it would be desirable to provide improved techniques, systems, and methods for lowering the internal signaling power consumption of a programmable logic device.

SUMMARY OF THE INVENTION

In accordance with the present invention, improved techniques, systems, and methods for lowering the internal signaling power consumption of a programmable logic device are provided.

The present invention achieves lower power consumption of a programmable logic device by reducing the total amount of charge that needs to be routed through the interconnection resources. Driver circuitry is provided for driving a routing signal from source operational circuitry to receiver circuitry via an interconnection conductor. The driver circuitry limits the routing signal from being driven all the way to the extremes of the programmable logic device's power supply.

In accordance with the present invention, there is provided a programmable logic device that includes first operational circuitry, second operational circuitry, routing driver circuitry coupled to an output signal of the first operational circuitry, routing receiver circuitry coupled to an input of the second operational circuitry, and an interconnection conductor that extends from the driver circuitry to the receiver circuitry. The driver circuitry is configured to drive a routing signal onto the interconnection conductor such that the voltage swing of the routing signal is less than the voltage swing of the output signal of the first operational circuitry.

BRIEF DESCRIPTION OF THE DRAWINGS

The above and other advantages of the invention will be more apparent upon consideration of the following detailed description, taken in conjunction with the accompanying drawings, in which like reference characters refer to like parts throughout, and in which.

DETAILED DESCRIPTION OF THE PREFERRED EMBODIMENTS

Figure 1:
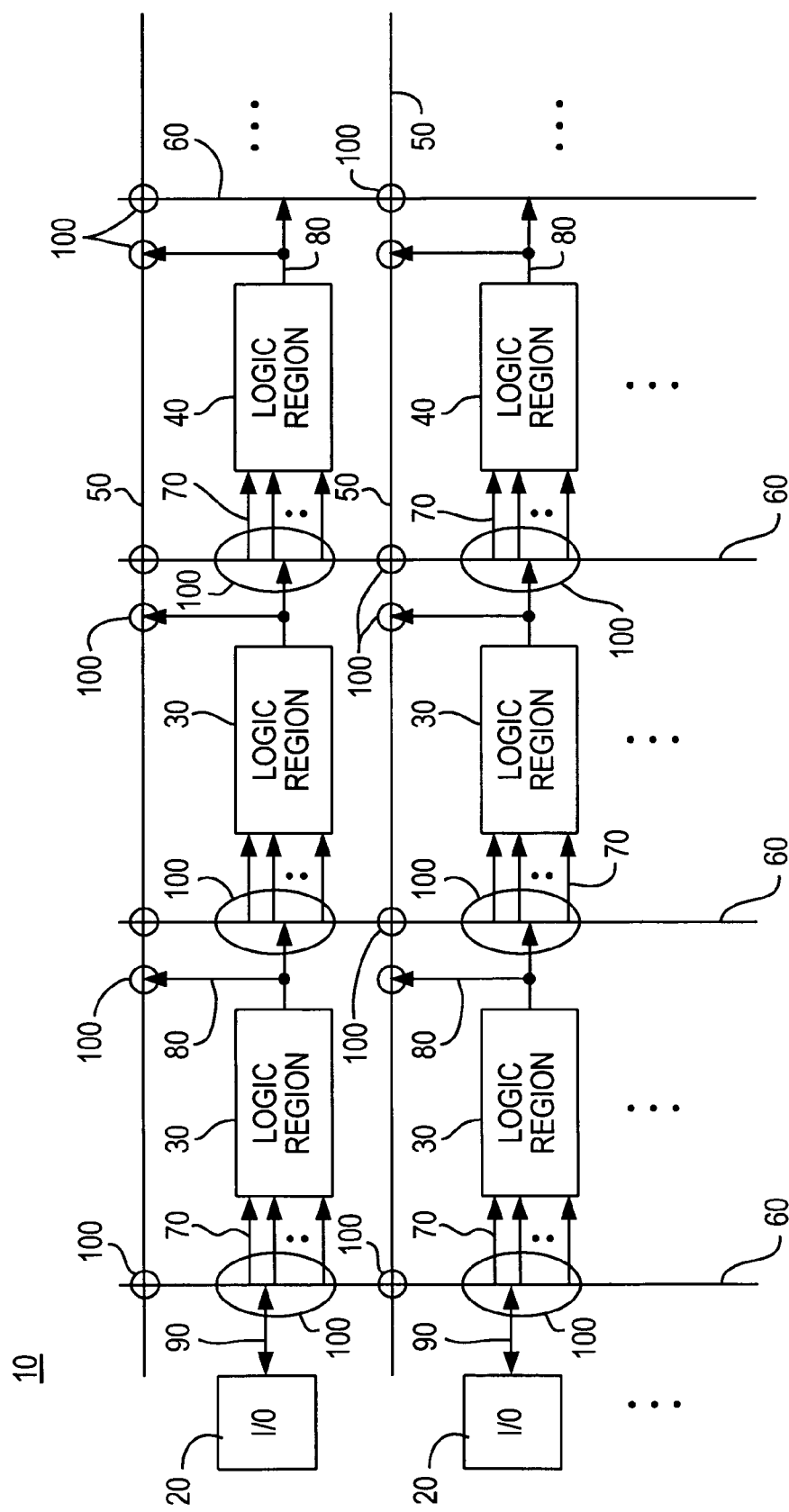
FIG. 1 is a simplified schematic block diagram of a representative portion of an illustrative PLD which can be constructed in accordance with the present invention.

FIG. 1 shows a representative portion of an illustrative PLD 10 that can be constructed in accordance with the invention. PLD 10 includes regions 20 of input/output (I/O) circuitry, regions 30 of programmable logic, and regions 40 of user-accessible memory. Other types of operational circuitry (e.g., microprocessor circuitry) may also be included on PLD 10. For example, such other circuitry may be in addition to what is shown in FIG. 1, or it may take the place of some of regions 40. Interconnection resources are also included on PLD 10. These resources include horizontal interconnection resources 50, vertical interconnection resources 60, region feeding resources 70, region output resources 80, and I/O serving resources 90. (Single lines in FIG. 1 may represent multiple, substantially parallel conductors.) The interconnection resources also include programmable connections between the various types of other interconnection resources. These programmable connections are represented by the circles or other shapes indicated by reference numbers 100 at the intersections of possibly connectable conductors. Connections 100 can be relatively simple and conventional programmable logic connectors (PLCs) controlled by conventional programmable function control elements (FCEs).

The interconnection resources are programmable to connect substantially any signal source to substantially any signal destination in PLD 10. As just one example of this, a signal from upper left I/O region 20 can be routed through the interconnection resources to the lowest input 70 to the logic region 30 nearest the center of FIG. 1. Various ones of resources 50, 60, 90, and 100 are used to provide such routing. As another example, an output signal of the upper left logic region 30 can be routed to the uppermost input 70 of the logic region 30 nearest the center of FIG. 1. Various ones of resources 50, 60, 80, and 100 are used to provide such routing.

Figure 2:
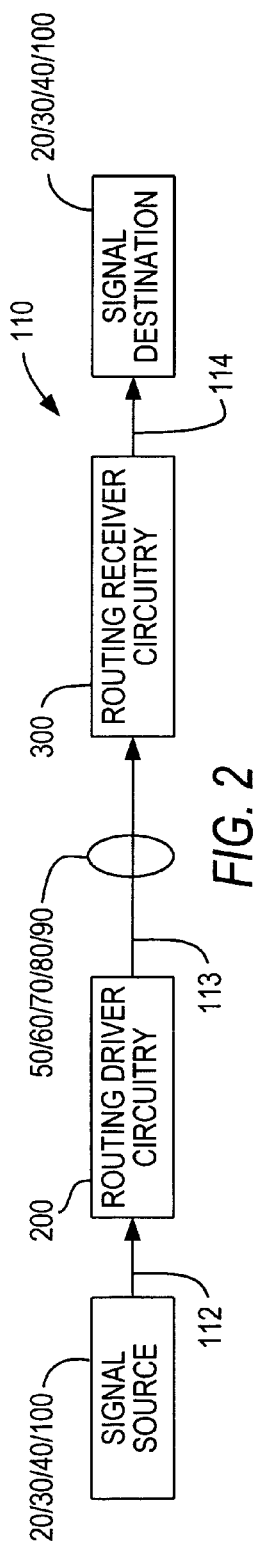
FIG. 2 is a simplified schematic block diagram of illustrative signaling circuitry in accordance with the present invention.

FIG. 2 shows one illustrative signaling path arrangement 110 on PLD 10 (FIG. 1) in accordance with this invention. The source of the signal in path 110 can be any of an I/O region 20, a logic region 30, a memory region 40, a programmable interconnection 100, or any other signal source on PLD 10. A source signal 112 produced by source 20/30/40/100 is applied to routing driver circuitry 200. Driver circuitry 200 drives source signal 112 onto a conductor that can be any of types 50, 60, 70, 80, or 90, or any other type of conductor used on PLD 10, as routing signal 113. The conductor 50/60/70/80/90 extending from driver circuitry 200 runs to routing receiver circuitry 300. Receiver circuitry 300 passes routing signal 113 on conductor 50/60/70/80/90 as destination signal 114 for application to the associated signal destination, which (like the signal source) can be any of an I/O region 20, a logic region 30, a memory region 40, a programmable interconnection 100, or any other signal destination on PLD 10. Details of illustrative constructions of circuits 200 and 300 in accordance with this invention are provided later in this specification.

Figure 3:
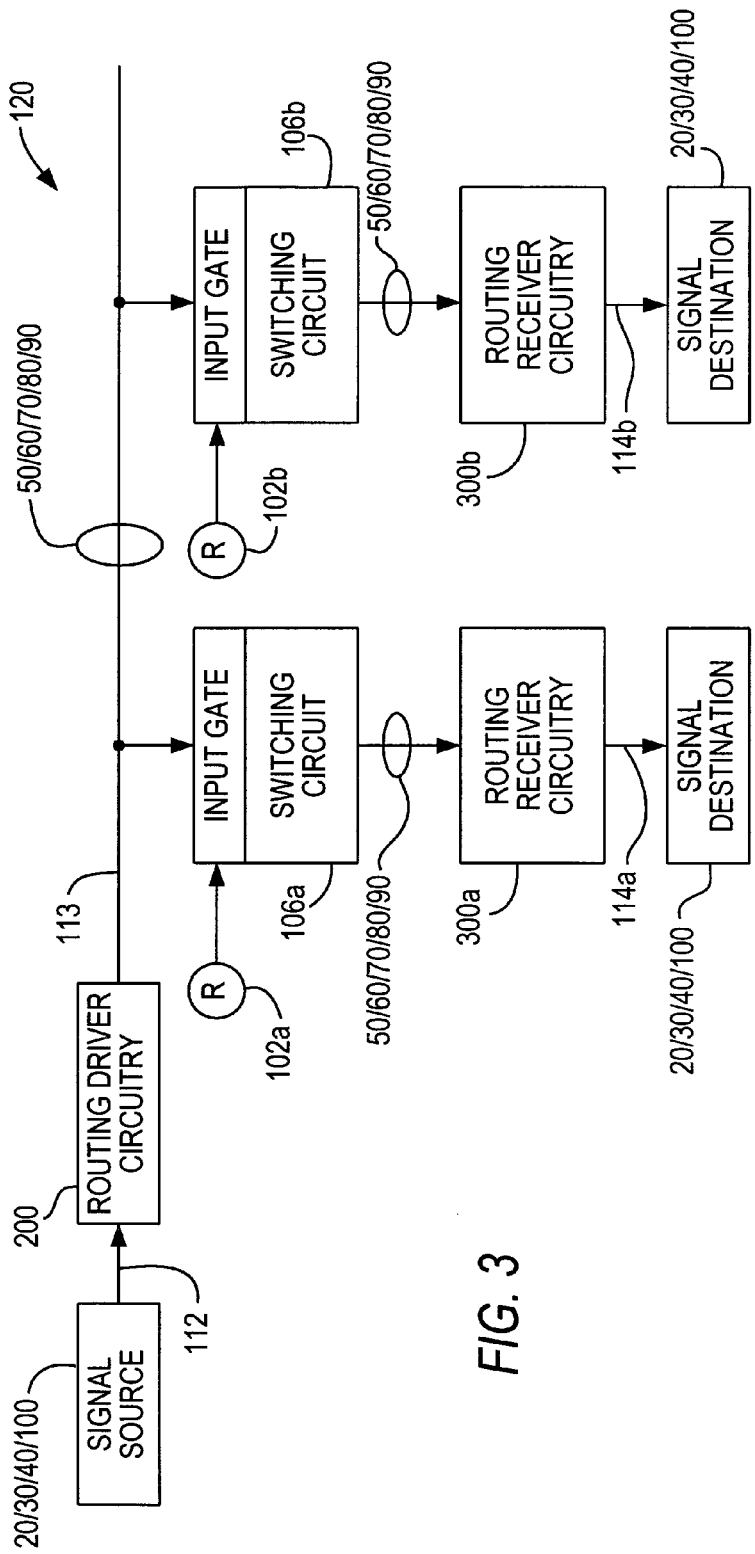
FIG. 3 is a simplified schematic block diagram of other illustrative signaling circuitry in accordance with the present invention.

Another illustrative signaling path arrangement 120 on PLD 10 (FIG. 1) in accordance with the invention is shown in FIG. 3. The signal source element 20/30/40/100, the routing driver circuitry 200, and the output conductor 50/60/70/80/90 of circuitry 200 can be similar to the corresponding elements in FIG. 2. The "horizontal" conductor 50/60/70/80/90 is connected to the input gate of each of two (or more) switching circuits 106a and 106b. The input gate of each of circuits 106 is controlled by an associated programmable function control element (FCE) 102a/102b. If it is desired for a circuit 106 to input and pass on the signal on the horizontal conductor 50/60/70/80/90, the FCE 102 associated with that circuit 106 is programmed to enable the input gate of that circuit. The circuit 106 can then receive and pass on to the associated "vertical" conductor 50/60/70/80/90 the routing signal 113 on the horizontal conductor 50/60/70/80/90. Each routing receiver circuitry 300a or 300b that thus receives routing signal 113 passes that signal as a destination signal 114 for use by the associated signal destination element 20/30/40/100. Each receiver circuitry 300 in FIG. 3 can be similar to circuitry 300 in FIG. 2, and the signal destination elements 20/30/40/100 in FIG. 3 can each be similar to the signal destination element in FIG. 2.

Figure 4:
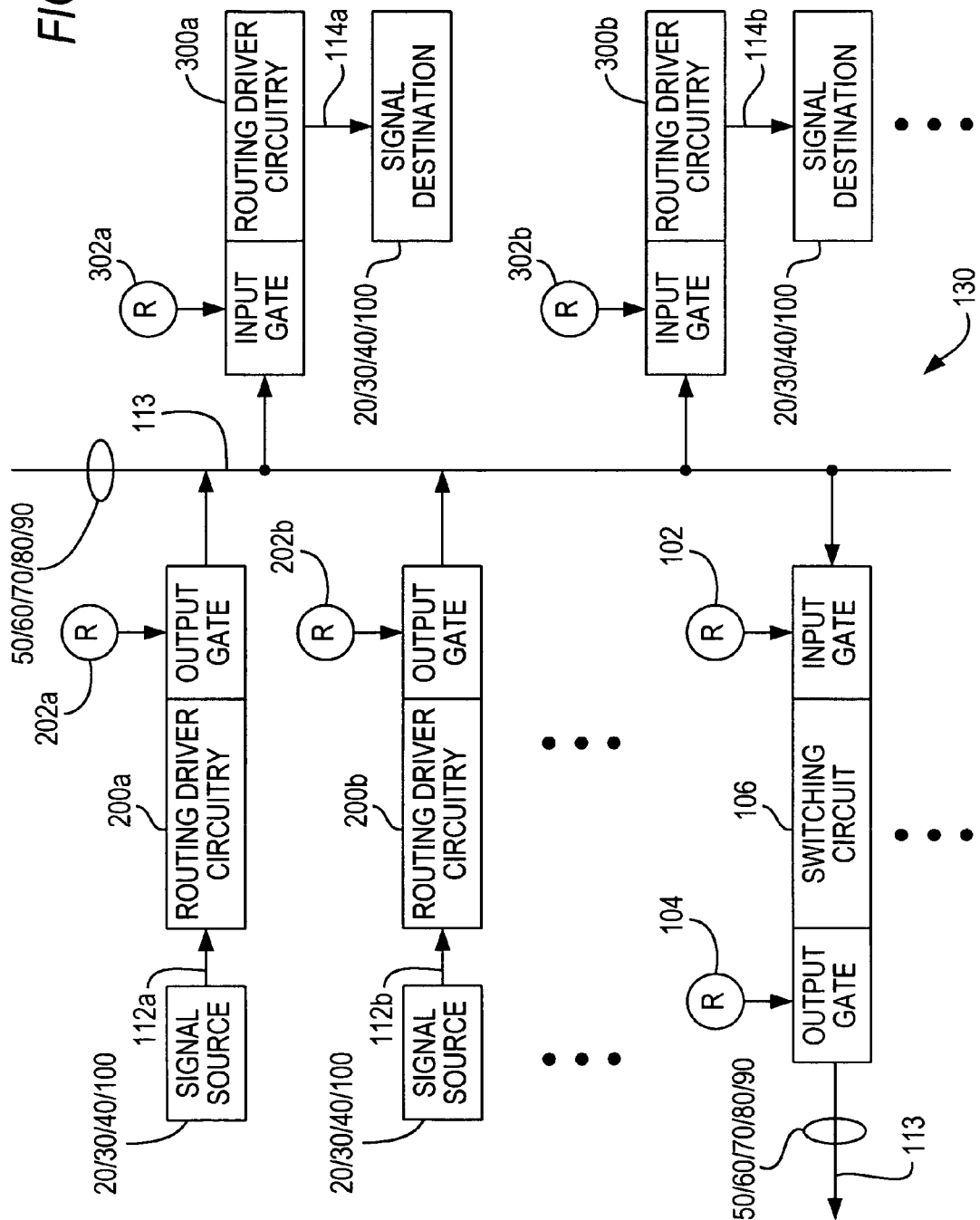
FIG. 4 is a simplified schematic block diagram of still other illustrative signaling circuitry in accordance with the present invention.

Still another illustrative signaling path arrangement 130 on PLD 10 (FIG. 1) in accordance with the invention is shown in FIG. 4. Each signal source element 20/30/40/100 in FIG. 4 can be similar to the signal source elements in FIGS. 2 and 3. Each routing driver circuitry 200 in FIG. 4 can be similar to driver circuitry 200 in FIGS. 2 and 3, except that in FIG. 4 each driver circuitry 200 is shown having output gates controlled by FCEs 202. Thus each driver circuitry 200 in FIG. 4 outputs a routing signal 113 only when the associated output gates are enabled by the associated FCE 202. In this way "vertical" interconnection conductor 50/60/70/80/90 can be driven by either of two (or more) driver circuitries 200.

Each routing receiver circuitry 300 in FIG. 4 can be similar to receiver circuitry 300 in FIGS. 2 and 3, except that in FIG. 4 each receiver circuitry 300 is shown having an input gate controlled by FCEs 302. Thus each receiver circuitry 300 receives routing signals 113 and passes destination signals 114 from vertical conductor 50/60/70/80/90 only if its associated input gate is enabled by the associated FCE 302. Each signal destination element 20/30/40/100 in FIG. 4 can be similar to the signal destination elements in FIGS. 2 and 3.

Switching circuit 106 in FIG. 4 is similar to any of the switching circuits 106 in FIG. 3, except that in FIG. 4 circuit 106 additionally has an output gate controlled by FCE 104. Thus circuit 106 in FIG. 4 outputs a signal only if its output gate is enabled by the associated FCE 104.

From the illustrative examples shown in FIGS. 2-4, it will be understood how any or all of the interconnection resources 50/60/70/80/90 in illustrative PLD 10 (FIG. 1) can be signaling or routing circuitry in accordance with this invention.

Circuitry and methods according to the invention provide a system that lowers the internal signaling power consumption of a programmable logic device. In particular, circuitry according to the invention achieves lower power consumption of a programmable logic device by reducing the total amount of charge that needs to be routed through the various signaling paths of the device. Typically, operating voltage is the supply voltage being supplied to the signal path circuitry of the device, and is commonly referred to as $V_{CC}$.

Signal path circuitry according to the invention translates voltages that are lower than the source voltage by using "reversed" routing driver circuitry. The reversed routing driver circuitry limits the range of its output in the signal path circuitry to prevent the routed signal from being driven all the way to the extremes of the device's power supply (i.e., Ground to $V_{CC}$). For example, in one embodiment of routing driver circuitry of the invention, a HIGH input source signal (e.g., $V_{CC}$) is driven as a routing signal to an output voltage (e.g., $V_{CCP}=V_{CC}-V_{TN}$) lower than the voltage of the input source signal. Likewise, a LOW input source signal (e.g., $V_{SS}$) is driven as a routing signal to an output voltage (e.g., $V_{SSP}=V_{TP}$) higher than the voltage of the input source signal. In this case, the routing driver circuitry limits the range of its output voltage (i.e., reduces the voltage swing) on the interconnection resources in the signal path circuitry to lower power consumption on the PLD. The signal path circuitry of the invention may also include routing receiver circuitry having a mixture of pass gates and latch/buffer circuitry to restore the routing signal to full-rail as a destination signal.

Figure 5:
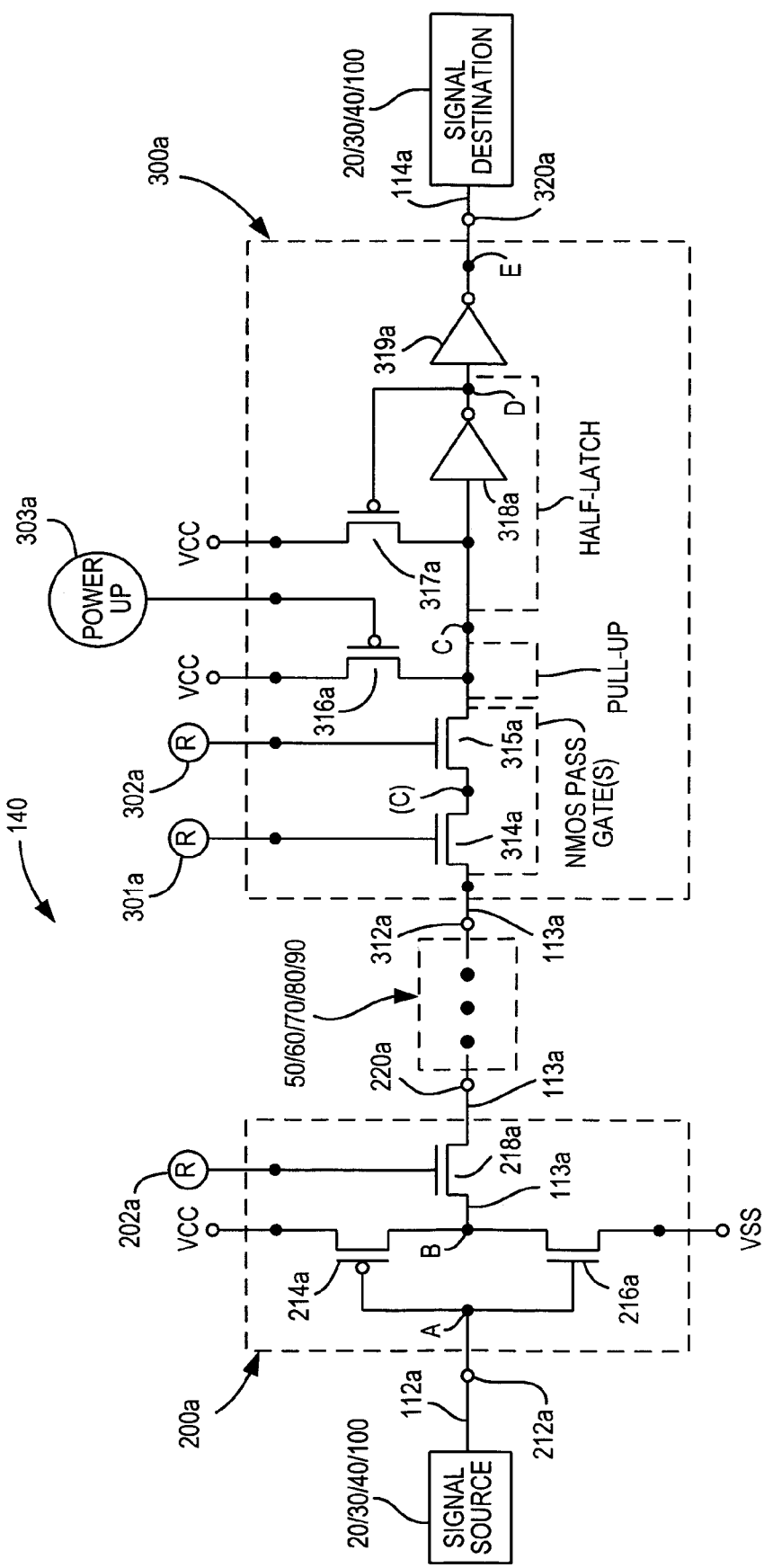
FIG. 5 is a more detailed schematic diagram of prior art circuitries of the type shown in FIGS. 2-4.

FIG. 5 shows an example of a prior art $V_{CC}$ to $V_{SS}$ voltage level signal path circuitry 140. Conventional signal path circuitry 140 includes routing driver circuitry 200a and routing receiving circuitry 300a. (Reference numbers with letter suffixes like 200a, 200b, 300a, 300b, etc. are used in FIGS. 5-7 to help distinguish different illustrative embodiments of generally similar circuitries. In earlier FIGS., similar reference numbers with letter suffixes are used for a different purpose (i.e., to distinguish different instances of the same circuitry). It is not to be understood, for example, that the circuitry 300a in FIG. 4 can only be constructed like embodiment 300a in FIG. 5. Rather, any of the embodiments 300a-c shown respectively in FIGS. 5, 6, and 7 can be used for circuitry 300a in FIG. 4, or indeed for any instance of a routing receiver circuitry 300 in any of FIGS. 2-4.)

Each signal source element 20/30/40/100 in FIG. 5 can be similar to the signal source elements in FIGS. 2-4. The source of the signal in the signal path of circuitry 140 can be any of an I/O region 20, a logic region 30, a memory region 40, a programmable interconnection 100, or any other signal source on PLD 10; A source signal 112a produced by source 20/30/40/100 is applied to routing driver circuitry 200a. Driver circuitry 200a drives source signal 112a onto a conductor that can be any of types 50, 60, 70, 80, or 90 or any other type of conductor used on PLD 10. The conductor 50/60/70/80/90 extending from driver circuitry 200a runs to routing receiver circuitry 300a. Each signal destination element 20/30/40/100 in FIG. 5 can be similar to the signal destination elements in FIGS. 2-4. Receiver circuitry 300a passes routing signal 113a on conductor 50/60/70/80/90 as destination signal 114a for application to the associated signal destination, which (like the signal source) can be any of an I/O region 20, a logic region 30, a memory region 40, a programmable interconnection 100, or any other signal destination on PLD 10.

In FIG. 5, source signal 112a from the associated signal source 20/30/40/100 is applied to the input terminal 212a of routing driver circuitry 200a. $V_{CC}$ is a source of power or logic 1 voltage or potential. $V_{SS}$ is ground or logic 0 voltage or potential. Element 214a is a PMOS transistor or gate. Elements 216a and 218a are NMOS transistors or gates. Element 202a is an FCE (described earlier). Terminal 220a is the output terminal of routing driver circuitry 200a. Elements 202a and 218a are all optional and can be omitted for any circuitry 200a that is the sole drive for the associated interconnection conductor 50/60/70/80/90.

Node A, which is formed between the gates of PMOS transistor 214a and NMOS transistor 216a, is connected to input terminal 212a of driver circuitry 200a. Node B, which is formed between the drain of PMOS transistor 214a and the source of NMOS transistor 216a, is connected to output terminal 220a of circuitry 200a (optional transistor 218a may be coupled between node B and terminal 220a if needed). The source of PMOS transistor 214a is coupled to $V_{CC}$ and the drain of NMOS transistor 216a is coupled to $V_{SS}$.

It will be understood that the drain and source orientation of the transistors described herein with respect to driver circuitry 200a is not intended to be limiting, but merely illustrative of one way such transistors can be constructed. Therefore, the terms "source" and "drain" are to be interpreted in their broadest sense.

Operation of the prior art driver circuitry 200a shown in FIG. 5 is as follows. (This description assumes that if optional elements 202a and 218a are present, then FCE 202a is programmed to turn ON transistor 218a.) When source signal 112a is HIGH (i.e., equal to $V_{CC}$), NMOS transistor 216a is ON and PMOS transistor 214a is OFF. When NMOS transistor 216a is ON, a direct path exists through transistor 216a, between $V_{SS}$ and node B. Therefore, output terminal 220a of driver circuitry 200a passes low signal $V_{SS}$ as routing signal 113a to interconnection conductor 50/60/70/80/90. On the other hand, when source signal 112a is LOW (i.e., equal to $V_{SS}$) PMOS transistor 214a is ON and NMOS transistor 216a is OFF. When PMOS transistor 214a is ON, a direct path exists through transistor 214a, between $V_{CC}$ and node B. Therefore, output terminal 220a of driver circuitry 200a passes high signal $V_{CC}$ as routing signal 113a to interconnection conductor 50/60/70/80/90. The routing driver circuitry 200a thus clearly functions as an inverter.

The high and low output levels at node B (and thus output terminal 220a) equal $V_{CC}$ and $V_{SS}$, respectively. In other words, the voltage swing of routing driver circuitry 200a is equal to the supply voltage. The range of output voltages driven by routing driver circuitry 200a as routing signal 113a varies all the way between $V_{CC}$ and $V_{SS}$.

The routing signal 113a driven onto interconnection conductor 50/60/70/80/90 is applied to routing receiver circuitry 300a. Receiver circuitry 300a passes routing signal 113a on conductor 50/60/70/80/90 as destination signal 114a for application to the associated signal destination, which (like the signal source) can be any of an I/O region 20, a logic region 30, a memory region 40, a programmable interconnection 100, or any other signal destination on PLD 10, similar to the signal destination elements in FIGS. 2-4.

In FIG. 5, routing signal 113a from the interconnection conductor 50/60/70/80/90 is applied to the input terminal 312a of prior art routing receiver circuitry 300a. $V_{CC}$ is a source of power or logic 1 voltage or potential. $V_{SS}$ is ground or logic 0 voltage or potential. Elements 314a and 315a are NMOS transistors or gates. Elements 316a and 317a are PMOS transistors or gates. Elements 301a and 302a are FCEs. Element 303a is an active global signal (i.e., a power-up latch reset signal) that is LOW at power-up. Elements 318a and 319a are inverters. Terminal 320a is the output terminal of routing receiver circuitry 300a. NMOS transistor 315a and FCE 302a together, and in combination with optional NMOS transistor 314a and FCE 301a, form a pass gate. Inverter 318a in combination with PMOS transistor 317a forms a common half-latch. PMOS transistor 316a in combination with power-up signal 303a forms a "pull-up" circuit.

Node C is formed between the drain of NMOS "pass gate" transistor 315a and the drains of PMOS transistors 316a and 317a. The source of NMOS pass gate transistor 315a is coupled to input terminal 312a (optional NMOS pass gate transistor 314a may be coupled between terminal 312a and the source of NMOS pass gate transistor 315a at node (C) if desired). Node D is formed between the gate of PMOS transistor 317a and the output of inverter 318a. Node E, which is formed at the output of inverter 319a, is connected to output terminal 320a of circuitry 300a. The gate of NMOS transistor 314a is coupled to FCE 301a and the gate of NMOS transistor 315a is coupled to FCE 302a. The gate of PMOS transistor 316a is coupled to power-up signal 303a while the source of each of PMOS transistors 316a and 317a is coupled to $V_{CC}$.

It will be understood that the drain and source orientation of the transistors described herein with respect to routing receiver circuitry 300a is not intended to be limiting, but merely illustrative of one way such transistors can be constructed. Therefore, the terms "source" and "drain" are to be interpreted in their broadest sense.

Operation of the conventional receiver circuitry 300a shown in FIG. 5 is as follows. (This description assumes that if optional elements 301a and 314a are present, then FCE 301a is programmed to turn ON transistor 314a.) When routing signal 113a is HIGH (i.e., source signal 112a is equal to $V_{SS}$), NMOS pass gates 314a and 315a pass HIGH routing signal 113a if FCEs 301a and 302a are programmed to turn transistors 314a and 315a ON, respectively. If one or both of FCEs 301a and FCE 302a is not programmed to turn ON its respective pass transistor (i.e., if either or both of FCEs 301a and 302a are LOW), then routing signal 113a is not being passed to node C of receiver circuitry 300a and, therefore, node C is floating. In that instance, which at least occurs at power-up of the programmable logic device on which signal path circuitry 140 is contained when all FCEs are cleared (i.e., are LOW), power-up signal 303a of the pull-up circuit turns PMOS transistor 316a ON, thereby setting node C HIGH by passing $V_{CC}$ through transistor 316a. In all other cases, when both of FCEs 301a and 302a are programmed to turn transistors 314a and 315a ON, respectively, the pull-up circuit becomes inactive and node C is driven by routing signal 113a via transistor 315a (and transistor 314a if provided).

Once routing signal 113a is passed by one or both of the NMOS pass gates to node C (or once node C is set high by the pull-up circuit), the common half-latch circuitry formed by PMOS transistor 317a and inverter 318a holds the signal at node D to $V_{CC}$ or $V_{SS}$, whichever is substantially the inverse of the signal at node C. Therefore, whatever current leakage occurs due to the pass gate(s), the half-latch will set the signal at node D equal to one of the full-rail values of the supply voltage (i.e., $V_{CC}$ or $V_{SS}$). Inverter 319a is also provided to hold the signal at node E to $V_{CC}$ or $V_{SS}$, whichever is substantially the inverse of the signal at node D. Therefore, whenever FCE 301a is programmed to turn ON transistor 314a and FCE 302a is programmed to turn ON transistor 315a, output terminal 320a of receiver circuitry 300a passes HIGH signal $V_{CC}$ as destination signal 114a to destination circuitry 20/30/40/100 when source signal 112a is LOW, and thus routing signal 113a at node B is HIGH. Also, whenever FCE 301a is programmed to turn ON transistor 314a and FCE 302a is programmed to turn ON transistor 315a, output terminal 320a of receiver circuitry 300a passes LOW signal $V_{SS}$ as destination signal 114a to destination circuitry 20/30/40/100 when source signal 112a is HIGH, and thus routing signal 113a at node B is LOW. Yet, whenever one or both of FCEs 301a and 302a are not programmed to turn ON respective transistors 314a and 315a, output terminal 320a of receiver circuitry 300a passes HIGH signal $V_{CC}$ as destination signal 114a to destination circuitry 20/30/40/100 due to the pull-up circuitry of receiver circuitry 300a and regardless of source signal 112a.

Therefore, prior art signal path circuitry 140 drives a $V_{CC}$ source signal 112a via driver circuitry 200a as a $V_{SS}$ routing signal 113a along interconnection conductor 50/60/70/80/90, and passes the $V_{SS}$ routing signal 113a to source destination circuitry 20/30/40/100 as a $V_{SS}$ destination signal 114a. Similarly, prior art signal path circuitry 140 drives a $V_{SS}$ source signal 112a via driver circuitry 200a as a $V_{CC}$ routing signal 113a along interconnection conductor 50/60/70/80/90, and passes the $V_{CC}$ routing signal 113a to source destination circuitry 20/30/40/100 as a $V_{CC}$ destination signal 114a. Thus, the voltage swing of routing signal 113a driven along interconnection conductor 50/60/70/80/90 is equal to the supply voltage of signal path circuitry 140 (i.e., $V_{CC}$ to $V_{SS}$).

Figure 6:
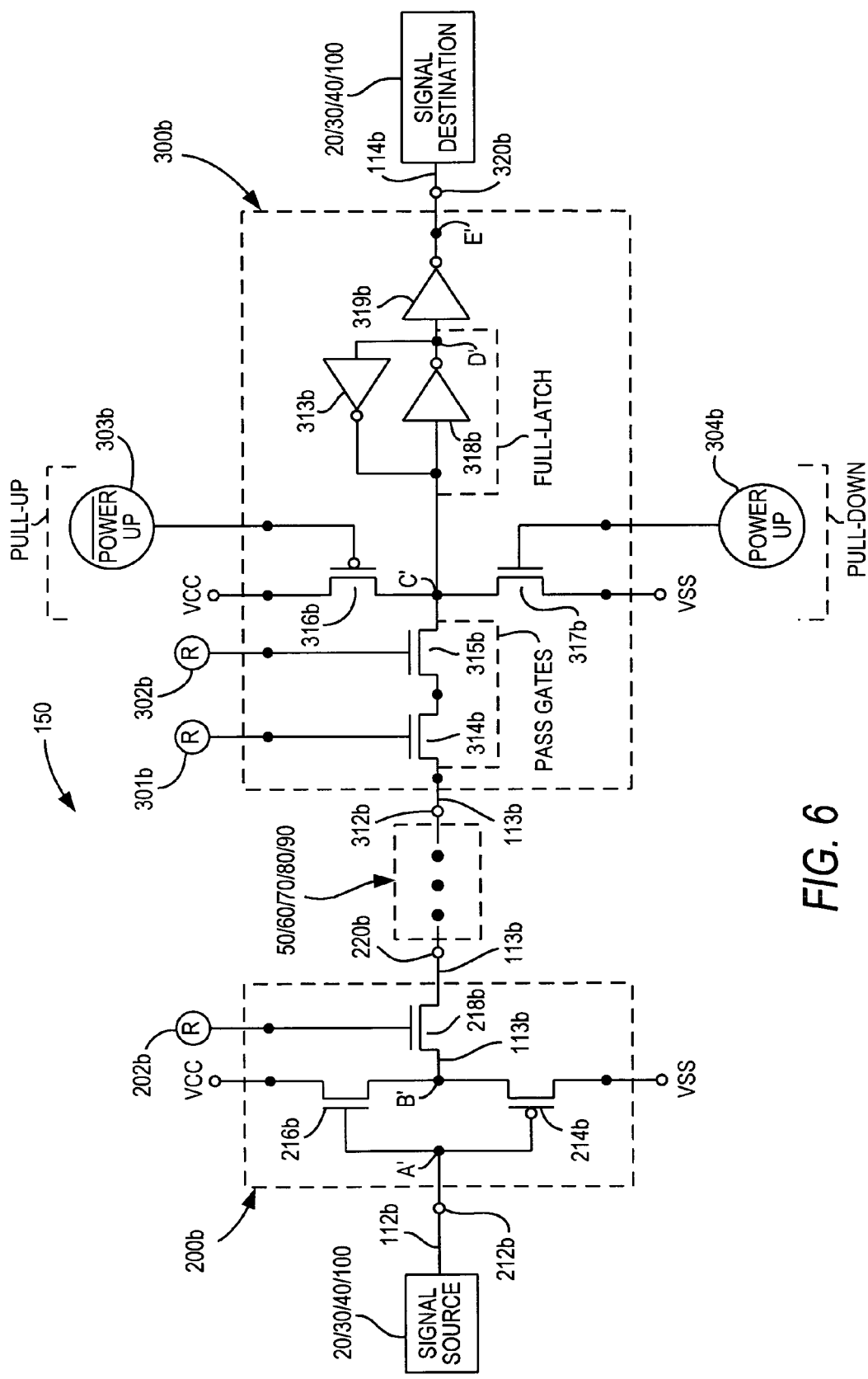
FIG. 6 is a detailed schematic diagram, similar to the diagram of FIG. 5, of an illustrative embodiment of possible modifications of portions of the circuitries of FIG. 5 in accordance with the present invention.

FIG. 6 shows a detailed schematic diagram of a reduced voltage swing signal path circuitry 150 according to the present invention. Signal path circuitry 150 includes "reversed" routing driver circuitry 200b and routing receiver circuitry 300b.

Each signal source element 20/30/40/100 in FIG. 6 can be similar to the signal source elements in FIGS. 2-5. The source of the signal in the signal path of circuitry 150 can be any of an I/O region 20, a logic region 30, a memory region 40, a programmable interconnection 100, or any other signal source on PLD 10. A source signal 112b produced by source 20/30/40/100 is applied to routing driver circuitry 200b. Driver circuitry 200b drives source signal 112b onto a conductor that can be any of types 50, 60, 70, 80, or 90 or any other type of conductor used on PLD 10. The conductor 50/60/70/80/90 extending from driver circuitry 200b runs to routing receiver circuitry 300b. Each signal destination element 20/30/40/100 in FIG. 6 can be similar to the signal destination elements in FIGS. 2-5. Receiver circuitry 300b passes the signal on conductor 50/60/70/80/90 as destination signal 114b for application to the associated signal destination, which (like the signal source) can be any of an I/O region 20, a logic region 30, a memory region 40, a programmable interconnection 100, or any other signal destination on PLD 10.

In FIG. 6, source signal 112b from the associated signal source 20/30/40/100 is applied to the input terminal 212b of routing driver circuitry 200b. $V_{CC}$ is a source of power or logic 1 voltage or potential. $V_{SS}$ is ground or logic 0 voltage or potential. Element 214b is a PMOS transistor or gate. Elements 216b and 218b are NMOS transistors or gates. Element 202b is an FCE (described earlier). Terminal 220b is the output terminal of routing driver circuitry 200b. Elements 202b and 218b are all optional and can be omitted for any circuitry 200b that is the sole drive for the associated interconnection conductor 50/60/70/80/90.

Node A', which is formed between the gates of PMOS transistor 214b and NMOS transistor 216b, is connected to input terminal 212b of driver circuitry 200b. Node B', which is formed between the source of PMOS transistor 214b and the drain of NMOS transistor 216b, is connected to output terminal 220b of circuitry 200b (optional transistor 218b may be coupled between node B' and terminal 220b if needed). The drain of PMOS transistor 214 is coupled to $V_{SS}$ and the source of NMOS transistor 216 is coupled to $V_{CC}$.

It will be understood that the drain and source orientation of the transistors described herein with respect to driver circuitry 200b is not intended to be limiting, but merely illustrative of one way such transistors can be constructed. Therefore, the terms "source" and "drain" are to be interpreted in their broadest sense.

Operation of driver circuitry 200b shown in FIG. 6 is as follows. (This description assumes that if optional elements 202b and 218b are present, then FCE 202b is programmed to turn ON transistor 218b.) When source signal 112b is HIGH (i.e., equal to $V_{CC}$), NMOS transistor 216b is ON and PMOS transistor 214b is OFF. When NMOS transistor 216b is ON, a direct path exists through transistor 216b, between $V_{CC}$ and node B'. Therefore, output terminal 220b of driver circuitry 200b passes reduced-HIGH signal $V_{CCN}$ (i.e., $V_{CC}-V_{TN}$) as routing signal 113b to interconnection conductor 50/60/70/80/90. On the other hand, when source signal 112b is LOW (i.e., equal to $V_{SS}$) PMOS transistor 214b is ON and NMOS transistor 216b is OFF. When PMOS transistor 214b is ON, a direct path exists through transistor 214b, between $V_{SS}$ and node B'. Therefore, output terminal 220b of driver circuitry 200b passes increased-LOW signal $V_{SSP}$ (i.e., $V_{SS}+V_{TP}$) as routing signal 113b to interconnection conductor 50/60/70/80/90. The routing driver circuitry 200b thus clearly functions as an inverter with a reduced voltage swing. The "HIGH" and "LOW" output levels at node B' (and thus output terminal 220b) equal $V_{CCN}$ (i.e., $V_{CC}-V_{TN}$) and $V_{SSP}$ (i.e., $V_{SS}+V_{TP}$), respectively. In other words, the voltage swing of routing driver circuitry 200b is not equal to the supply voltage. Unlike in prior art driver circuitry 200a of FIG. 5, the range of output voltages driven by routing driver circuitry 200b as routing signal 113b of FIG. 6 cannot vary all the way between $V_{CC}$ and $V_{SS}$.

The routing signal 113b driven onto interconnection conductor 50/60/70/80/90 is applied to routing receiver circuitry 300b. Receiver circuitry 300b passes routing signal 113b on conductor 50/60/70/80/90 as destination signal 114b for application to the associated signal destination, which (like the signal source) can be any of an I/O region 20, a logic region 30, a memory region 40, a programmable interconnection 100, or any other signal destination on PLD 10, similar to the signal destination elements in FIGS. 2-5.

In FIG. 6, routing signal 113b from the interconnection conductor 50/60/70/80/90 is applied to the input terminal 312b of routing receiver circuitry 300b. $V_{CC}$ is a source of power or logic 1 voltage or potential. $V_{SS}$ is ground or logic 0 voltage or potential. Elements 314b and 317b are NMOS transistors or gates and elements 315b and 316b are PMOS transistors or gates. Elements 301b and 302b are FCEs. Elements 303b and 304b are active global signals (i.e., power-up latch reset signals) that are LOW and HIGH at power-up, respectively. Elements 313b, 318b, and 319b are inverters. Terminal 320b is the output terminal of routing receiver circuitry 300b. NMOS transistor 314b and FCE 301b, together and in combination with PMOS transistor 315b and FCE 302b, form pass gate circuitry. (It should be noted that the order of NMOS transistor 314b and PMOS transistor 315b may be switched, and these transistors may protect routing signal 113b from being brought to full-rail at node C' by the full latch of circuitry 300b). Inverter 313b in combination with inverter 318b form a common full-latch. PMOS transistor 316b in combination with power-up signal 303b forms a "pull-up" circuit, while NMOS transistor 317b in combination with power-up signal 304b forms a "pull-down" circuit. It should be noted that only one of the pull-up device or the pull-down circuit is necessary.

Node C' is formed between the drains of PMOS transistors 315b and 316b, the source of NMOS transistor 317b, the output of inverter 313b, and the input of inverter 318b. The source of PMOS pass gate transistor 315b is coupled to the drain of NMOS pass gate 314b. The source of NMOS pass gate 314b is coupled to input terminal 312b. Node D' is formed between the inputs of inverters 313b and 319b, and the output of inverter 318b. Node E', which is formed at the output of inverter 319b, is connected to output terminal 320b of circuitry 300b. The gate of NMOS transistor 314b is coupled to FCE 301b and the gate of PMOS transistor 315b is coupled to FCE 302b. The gate of PMOS transistor 316b is coupled to power-up signal 303b, while the gate of NMOS transistor 317b is coupled to power-up signal 304b. The source of PMOS transistor 316b is coupled to $V_{CC}$, while the drain of NMOS transistor 317b is coupled to $V_{SS}$.

It will be understood that the drain and source orientation of the transistors described herein with respect to routing receiver circuitry 300b is not intended to be limiting, but merely illustrative of one way such transistors can be constructed. Therefore, the terms "source" and "drain" are to be interpreted in their broadest sense.

Operation of receiver circuitry 300b shown in FIG. 6 is as follows. When routing signal 113b is a reduced-HIGH signal $V_{CCN}$ (i.e., source signal 112b is equal to $V_{CC}$), pass gates 314b and 315b pass reduced-HIGH routing signal 113b if FCEs 301b and 302b are programmed to turn ON transistors 314b and 315b, respectively. If either or both of FCEs 301b and 302b is not programmed to turn ON its respective pass transistor (i.e., if FCE 301b is LOW and/or FCE 302b is HIGH), then routing signal 113b is not being driven to node C' of receiver circuitry 300b and, therefore, node C' is floating. In that instance, which at least occurs at power-up of the programmable logic device on which circuitry 150 is contained, power-up signal 303b of the pull-up circuit may be programmed to turn PMOS transistor 316b ON, thereby setting node C' high by passing $V_{CC}$ through transistor 316b, or power-up signal FCE 304*b* of the pull-down circuit may be programmed to turn NMOS transistor 317*b* ON, thereby setting node C' low by passing $V_{SS}$ through transistor 317*b*, depending on which type of circuit the design called for. In all other cases, when both of FCEs 301*b* and 302*b* are programmed to turn ON transistors 314*b* and 315*b*, respectively, the pull-up circuit or pull-down circuit becomes inactive and node C' is driven by routing signal 113*b* via transistors 314*b* and 315*b*.

Unlike in the conventional receiver circuitry 300*a* of FIG. 5 which requires a pull-up circuit, one benefit of receiver circuitry 300*b* of the present invention is that a signal can be gated using a pull-up or a pull-down signal depending on the requirements of the design.

Once routing signal 113*b* is passed by pass gates 314*b* and 315*b* to node C' (or once node C' is set HIGH by the pull-up circuit or set LOW by the pull-down circuit), the full-latch circuitry formed by inverters 313*b* and 318*b* brings the signal at node D' to full-rail $V_{CC}$ or $V_{SS}$, whichever is substantially the inverse of the reduced or increased value of the signal at node C'. Therefore, whatever current leakage occurs due to the pass gates, the full-latch will set the signal at node D' equal to the full-rail values of the supply voltage (i.e., $V_{CC}$ or $V_{SS}$) albeit inverse full-rail values. Finally, inverter 319*b* inverts the value of the signal at node E'. Therefore, whenever FCE 301*b* is programmed to turn ON transistor 314*b* and FCE 302*b* is programmed to turn ON transistor 315*b*, output terminal 320*b* of receiver circuitry 300*b* passes HIGH signal $V_{CC}$ as destination signal 114*b* to destination circuitry 20/30/40/100 when source signal 112*b* is HIGH, and thus routing signal 113*b* at node B' is reduced-HIGH signal $V_{CCN}$ (i.e., $V_{CC}-V_{TN}$). Also, whenever FCE 301*b* is programmed to turn ON transistor 314*b* and FCE 302*b* is programmed to turn ON transistor 315*b*, output terminal 320*b* of receiver circuitry 300*b* passes LOW signal $V_{SS}$ as destination signal 114*b* to destination circuitry 20/30/40/100 when source signal 112*b* is LOW, and thus routing signal 113*b* at node B' is increased-LOW signal $V_{SSP}$ (i.e., $V_{SS}+V_{TP}$). Yet, whenever one or both of FCEs 301*b* and 302*b* are not programmed to turn ON respective transistors 314*b* and 315*b*, output terminal 320*b* of receiver circuitry 300*b* either passes LOW signal $V_{SS}$ as destination signal 114*b* due to the pull-down circuit if provided, or passes HIGH signal $V_{CC}$ as destination signal 114*b* due to the pull-up circuit if provided, regardless of source signal 112*b*.

Therefore, signal path circuitry 150 of the present invention drives a $V_{CC}$ source signal 112*b* via driver circuitry 200*b* as a reduced-HIGH $V_{CCN}$ routing signal 113*b* along interconnection conductor 50/60/70/80/90, while receiver circuitry 300*b* passes the reduced-HIGH $V_{CCN}$ routing signal 113*b* to source destination circuitry 20/30/40/100 as a full-rail $V_{CC}$ destination signal 114*b*. Similarly, signal path circuitry 150 drives a $V_{SS}$ source signal 112*b* via driver circuitry 200*b* as an increased-LOW $V_{SSP}$ routing signal 113*b* along interconnection conductor 50/60/70/80/90, while receiver circuitry 300*b* passes the increased-LOW $V_{SSP}$ routing signal 113*b* to source destination circuitry 20/30/40/100 as a full-rail $V_{SS}$ destination signal 114*b*. Thus, the voltage swing of routing signal 113*b* driven along interconnection conductor 50/60/70/80/90 is not equal to the supply voltage of signal path circuitry 150 (i.e., $V_{CC}$ to $V_{SS}$) but instead is limited to the range of $V_{CCN}$ to $V_{SSP}$.

Figure 7:
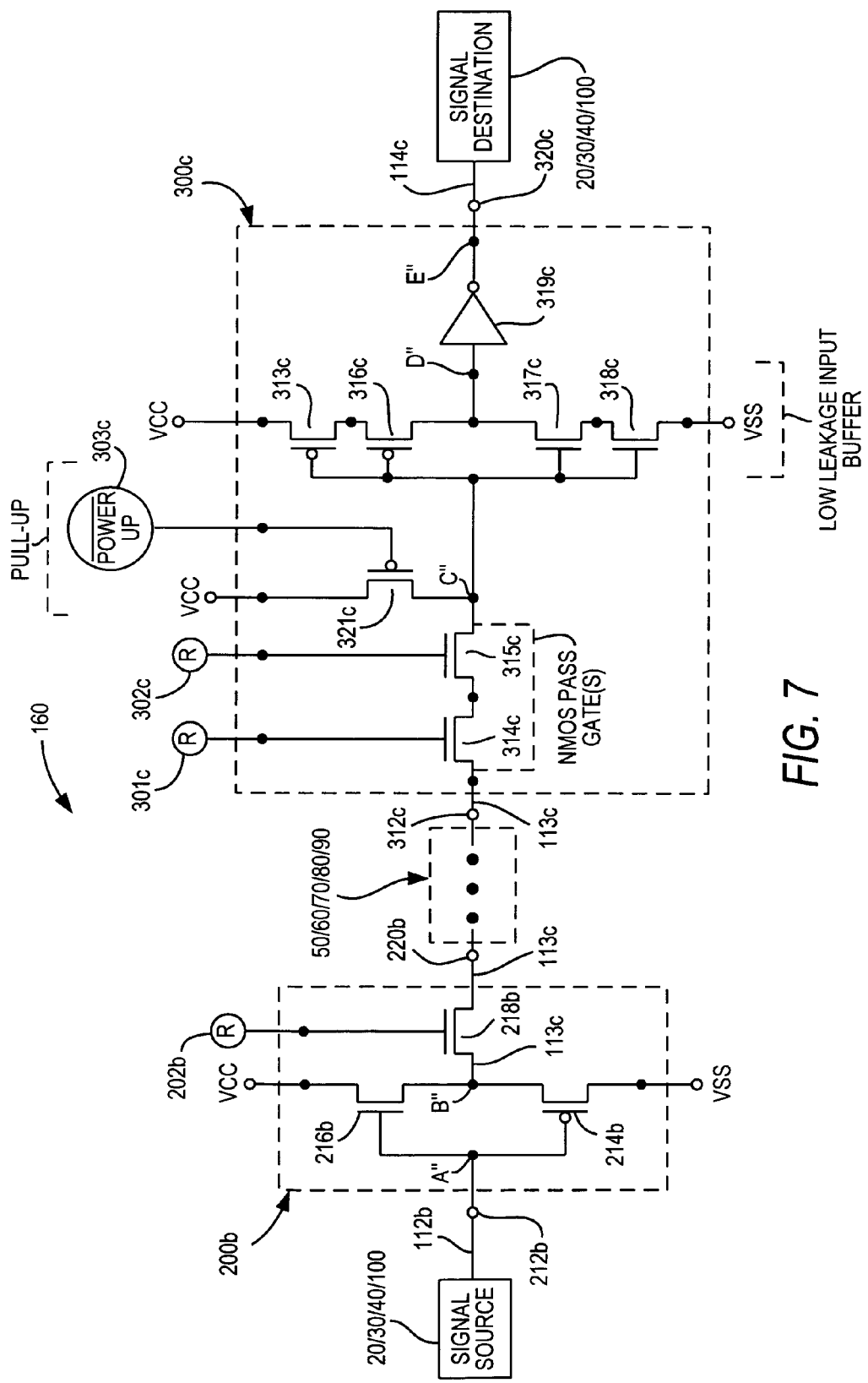
FIG. 7 is a detailed schematic diagram, similar to the diagrams of FIGS. 5 and 6, of a second illustrative embodiment of possible modifications of portions of the circuitries of FIG. 5 in accordance with the present invention.

FIG. 7 shows a detailed schematic diagram of a second embodiment of a reduced voltage swing signal path circuitry 160 according to the present invention. Signal path circuitry 160 includes "reversed" routing driver circuitry 200*b* of FIG. 6 and routing receiver circuitry 300*c*.

Each signal source element 20/30/40/100 in FIG. 7 can be similar to the signal source elements in FIGS. 2-6. The source of the signal in the signal path of circuitry 160 can be any of an I/O region 20, a logic region 30, a memory region 40, a programmable interconnection 100, or any other signal source on PLD 10. Routing driver circuitry 200*b* is described above with respect to FIG. 6. Driver circuitry 200*b* drives source signal 112*b* onto a conductor that can be any of types 50, 60, 70, 80, or 90 or any other type of conductor used on PLD 10. The conductor 50/60/70/80/90 extending from driver circuitry 200*b* runs to routing receiver circuitry 300*c*. Each signal destination element 20/30/40/100 in FIG. 7 can be similar to the signal destination elements in FIGS. 2-6. Receiver circuitry 300*c* passes the routing signal 113*c* on conductor 50/60/70/80/90 as destination signal 114*c* for application to the associated signal destination, which (like the signal source) can be any of an I/O region 20, a logic region 30, a memory region 40, a programmable interconnection 100, or any other signal destination on PLD 10.

As described above with respect to FIG. 6, output terminal 220*b* of driver circuitry 200*b* passes increased-LOW signal $V_{SSP}$ (i.e., $V_{SS}+V_{TP}$) as a routing signal (i.e., routing signal 113*c* with respect to signal path circuitry 150 of FIG. 7) to interconnection conductor 50/60/70/80/90. The routing driver circuitry 200*b* functions as an inverter with a reduced voltage swing. The "HIGH" and "LOW" output levels at node B" (and thus output terminal 220*b*) equal $V_{CCN}$ (i.e., $V_{CC}-V_{TN}$) and $V_{SSP}$ (i.e., $V_{SS}+V_{TP}$), respectively. In other words, the voltage swing of routing driver circuitry 200*b* is not equal to the supply voltage. Unlike in prior art driver circuitry 200*a* of FIG. 5, the range of output voltages driven by routing driver circuitry 200*b* as routing signal 113*c* of FIG. 7 does not vary all the way between $V_{CC}$ and $V_{SS}$.

The routing signal 113*c* driven onto interconnection conductor 50/60/70/80/90 is applied to routing receiver circuitry 300*c*. Receiver circuitry 300*c* passes routing signal 113*c* on conductor 50/60/70/80/90 as destination signal 114*c* for application to the associated signal destination, which (like the signal source) can be any of an I/O region 20, a logic region 30, a memory region 40, a programmable interconnection 100, or any other signal destination on PLD 10, similar to the signal destination elements in FIGS. 2-6.

In FIG. 7, routing signal 113*c* from the interconnection conductor 50/60/70/80/90 is applied to the input terminal 312*c* of routing receiver circuitry 300*c*. $V_{CC}$ is a source of power or logic 1 voltage or potential. $V_{SS}$ is ground or logic 0 voltage or potential. Elements 314*c*, 315*c*, 317*c*, and 318*c* are NMOS transistors or gates and elements 313*c*, 316*c*, and 321*c* are PMOS transistors or gates. Elements 301*c* and 302*c* are FCEs. Element 303*c* is an active global signal (i.e., a power-up latch reset signal) that is LOW at power-up. Element 319*c* is an inverter. Terminal 320*c* is the output terminal of routing receiver circuitry 300*c*. Elements 301*c* and 314*c* are all optional and can be omitted for any circuitry 300*c* to speed up the device while increasing CRAM count on the PLD. NMOS transistor 315*c* and FCE 302*c*, together and in combination with optional NMOS transistor 314*c* and FCE 301*c*, form a pass gate. PMOS transistor 321*c* in combination with power-up signal 303*c* forms a "pull-up" circuit. PMOS transistors 313*c* and 316*c* in combination with NMOS transistors 317*c* and 318*c* form a low leakage input buffer.

Node C" is formed between the drains of NMOS transistor 315*c* and PMOS transistor 321*c*, and between the gates of transistors 313*c* and 316*c*-318*c*. The source of NMOS pass gate transistor 315*c* is coupled to the drain of NMOS pass gate transistor 314c. The source of NMOS pass gate 314c is coupled to input terminal 312c. Node D" is formed between the drain of PMOS transistor 316c, the source of NMOS transistor 317c, and the input of inverter 319c. Node E", which is formed at the output of inverter 319c, is connected to output terminal 320c of circuitry 300c. The gate of NMOS transistor 314c is coupled to FCE 301c and the gate of NMOS transistor 315c is coupled to FCE 302c. The drain of PMOS transistor 313c is coupled to the source of PMOS transistor 316c, while the drain of NMOS transistor 317c is coupled to the source of NMOS transistor 318c. The source of PMOS transistor 313c is coupled to $V_{CC}$, while the drain of NMOS transistor 318c is coupled to $V_{SS}$.

It will be understood that the drain and source orientation of the transistors described herein with respect to routing receiver circuitry 300c is not intended to be limiting, but merely illustrative of one way such transistors can be constructed. Therefore, the terms "source" and "drain" are to be interpreted in their broadest sense.

Operation of receiver circuitry 300c shown in FIG. 7 is as follows. When routing signal 113c is a reduced-HIGH signal $V_{CCN}$ (i.e., source signal 112b is equal to $V_{CC}$), pass gates 314c and 315c pass reduced-HIGH routing signal 113b to node C" if FCEs 301c and 302c are programmed to turn ON transistors 314c and 315c, respectively. If either one or both of FCEs 301c and 302c is not programmed to turn ON its respective pass transistor (i.e., if FCE 301c or FCE 302c is LOW), then routing signal 113c is not being driven to node C" of receiver circuitry 300c and, therefore, node C" is floating. In that instance, which at least occurs when all FCEs are cleared (i.e., are LOW) at power-up of the programmable logic device on which circuitry 160 is contained, power-up signal 303c of the pull-up circuit turns PMOS transistor 321c ON, thereby setting node C" HIGH by passing $V_{CC}$ through transistor 321c. In all other cases, when FCEs 301c and 302c are programmed to turn ON transistors 314c and 315c, respectively, node C" is driven by routing signal 113c via transistors 314c and 315c.

Unlike with respect to the other receiver circuitries previously described herein, after the pass gates of receiver circuitry 300b there is no attempt to restore the signal at node C" to full-rail using latch circuitry. Instead, input buffer circuitry is provided that can tolerate a low voltage swing at its input. When routing signal 113c is passed by pass gates 314c and 315c to node C", the input buffer circuitry formed by transistors 313c and 316c-318c brings the signal at node D" to substantially the inverse of the reduced or increased value of the signal at node C", but at full-rail. Therefore, whatever current leakage occurs due to the pass gates, the low leakage input buffer will set the signal at node D" equal to the HIGH (i.e., $V_{CC}$) or LOW (i.e., $V_{SS}$) values of routing signal 113c, albeit inversed values. Finally, inverter 319c inverts the value of the signal at node E". Therefore, whenever FCES 301c and 302c are programmed to turn ON transistors 314c and 315c, respectively, output terminal 320c of receiver circuitry 300c passes HIGH signal $V_{CC}$ as destination signal 114c when source signal 112b is HIGH, and thus when routing signal 113c at node B" is reduced-HIGH signal $V_{CCN}$ (i.e., $V_{CC}-V_{TN}$). Also, whenever FCES 301c and 302c are programmed to turn ON transistors 314c and 315c, respectively, output terminal 320c of receiver circuitry 300c passes LOW signal $V_{SS}$ as destination signal 114c when source signal 112b is LOW, and thus when routing signal 113c at node B" is increased-LOW signal $V_{SSP}$ (i.e., $V_{SS}+V_{TP}$).

Therefore, signal path circuitry 160 of the present invention drives a HIGH $V_{CC}$ source signal 112b via driver circuitry 200b as a reduced-HIGH $V_{CCN}$ routing signal 113c along interconnection conductor 50/60/70/80/90, while receiver circuitry 300c passes the reduced-LOW $V_{CCN}$ routing signal 113c to source destination circuitry 20/30/40/100 as a full-rail HIGH $V_{CC}$ destination signal 114c. Similarly, signal path circuitry 160 drives a LOW $V_{SS}$ source signal 112b via driver circuitry 200b as an increased-LOW $V_{SSP}$ routing signal 113c along interconnection conductor 50/60/70/80/90, while receiver circuitry 300c passes the increased-LOW $V_{SSP}$ routing signal 113c to source destination circuitry 20/30/40/100 as a full-rail LOW $V_{SS}$ destination signal 114c. Thus, the voltage swing of routing signal 113c driven along interconnection conductor 50/60/70/80/90 is not equal to the supply voltage of signal path circuitry 160 (i.e., $V_{CC}$ to $V_{SS}$), but instead is limited to the range of $V_{CCN}$ to $V_{SSP}$.

Another benefit of receiver circuitry 300c of FIG. 7 is that functionality issues are reduced with respect to routing across process corners within the logic device. For example, when the conventional signal path circuitry 140 of FIG. 5 is utilized in a signaling arrangement like illustrative signaling arrangement 130 of FIG. 4, routing driver circuitry 200a is coupled to a large number of receiver circuitries, and therefore driver circuitry 200a is coupled to a large number of half-latches via an equally large number of NMOS pass gates. It is to be understood that the NMOS pull-down transistor 216a of driver circuitry 200a must overcome the PMOS feedback transistor 317a of each of the receiver circuitries 300a utilized in the signaling arrangement. If too many PMOS feedback transistors 317a coupled to driver circuitry 200a are turned ON, or if the NMOS pull-down transistor 216a is too weak due to process variation of the logic device, then the conventional signaling circuitry of FIG. 5 will fail to transition from $V_{CC}$ to $V_{SS}$. However, there is no feedback in receiver circuitry 300c of reduced voltage swing signal path circuitry 160 of FIG. 7. Therefore, the maximum number of receiver circuitries 300c that can be coupled to driver circuitry 200b may be used without needing to simulate the functionality across all process corners.

Figure 8:
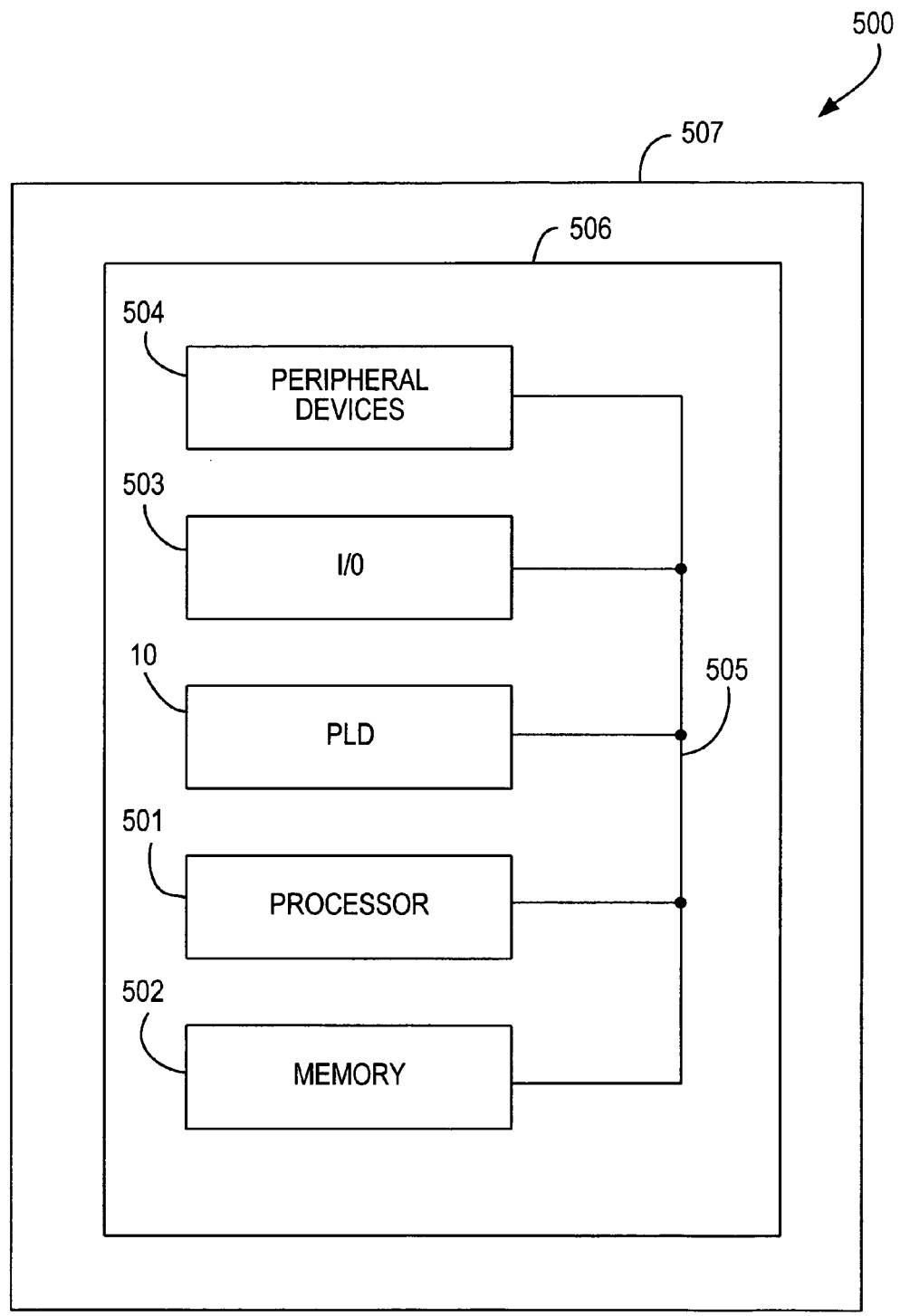
FIG. 8 is a simplified block diagram of an illustrative system employing a programmable logic device having signaling circuitry in accordance with the present invention.

Programmable logic device 10 constructed with any of the reduced voltage swing signal path circuitries described above may be used as part of a data processing system 500 shown in FIG. 8. Data processing system 500 may include one or more of the following components: a processor 501; memory 502; I/O circuitry 503; and peripheral devices 504. These components are coupled together by a system bus 505 and are populated on a circuit board 506, which is contained in an end-user system 507.

System 500 can be used in a wide variety of applications, such as computer networking, data networking, instrumentation, video processing, digital signal processing, or any other application where the advantage of using mask-programmable logic is desirable. Programmable logic device 10 can be configured to perform a variety of different logic functions. For example, logic device 10 can be configured as a processor or controller that works in cooperation with processor 501. Logic device 10 may also be used as an arbiter for arbitrating access to shared resources in system 500. In yet another example, logic device 10 can be configured as an interface between processor 501 and one of the other components in system 500. It should be noted that system 500 is only exemplary, and that the true scope and spirit of the invention should be indicated by the following claims.

Various integrated circuit process technologies can be used to implement logic devices 10 as described above according to this invention. In addition, other known signaling techniques such as low voltage differential signaling (LVDS) could be substituted for the single conductor signaling discussed in detail and still practice the principles of the invention.

It will be understood, therefore, that the foregoing is only illustrative of the principles of the invention, and that various modifications can be made by those skilled in the art without departing from the scope and spirit of the invention, and the present invention is limited only by the claims that follow.

What is claimed is:

1. A programmable logic device having programmable logic circuitry comprising:
   first operational circuitry;
   second operational circuitry;
   routing driver circuitry coupled to an output signal of the first operational circuitry;
   routing receiver circuitry coupled to an input of the second operational circuitry; and
   an interconnection conductor extending from the routing driver circuitry to the routing receiver circuitry, wherein the routing driver circuitry is configured to drive a routing signal onto the interconnection conductor, wherein the voltage swing of the routing signal is less than the voltage swing of the output signal of the first operational circuitry, wherein the routing receiver circuitry is configured to receive the routing signal from the interconnection conductor and to provide an input signal to the input of the second operational circuitry, and wherein at least one condition from the group consisting of the following is true: 1) the routing receiver circuitry comprises a full latch coupled to an inverter, and 2) the routing receiver circuitry comprises a low leakage input buffer coupled to an inverter.

2. The programmable logic device of claim 1, wherein the voltage swing of the output signal of the first operational circuitry is defined by a first low signal and a first high signal, wherein the voltage swing of the routing signal is defined by a second low signal and a second high signal, and wherein at least one condition from the group consisting of the following is true: 1) the second low signal is higher than the first low signal, and 2) the second high signal is lower than the first high signal.

3. The programmable logic device of claim 2, wherein the routing driver circuitry comprises a PMOS transistor coupled to an NMOS transistor.

4. The programmable logic device of claim 3, wherein a gate of the PMOS transistor and a gate of the NMOS transistor are coupled to the output signal of the first operational circuitry.

5. The programmable logic device of claim 4, wherein one condition from the group consisting of the following is true: 1) when the output signal of the first operational circuitry is defined by the first low signal, the PMOS transistor drives the second low signal onto the interconnection conductor as the routing signal, and 2) when the output signal of the first operational circuitry is defined by the first high signal, the NNOS transistor drives the second high signal onto the interconnection conductor as the routing signal.

6. The programmable logic device of claim 2, wherein the voltage swing of the input signal to the second operational circuitry is defined by a third low signal and a third high signal, and wherein at least one condition from the group consisting of the following is true: 1) the second low signal is higher than the third low signal, and 2) the second high signal is lower than the third high signal.

7. The programmable logic device of claim 6, wherein the routing receiver circuitry further comprises a pull-up circuit.

8. A digital processing system comprising:
   processing circuitry;
   a memory coupled to the processing circuitry; and
   the programmable logic device as defined in claim 1 coupled to the processing circuitry and the memory.

9. A printed circuit board on which is mounted the programmable logic device as defined in claim 1.

10. The printed circuit board defined in claim 9 further comprising:
    a memory mounted on the printed circuit board and coupled to the programmable logic device.

11. The printed circuit board defined in claim 10 further comprising:
    processing circuitry mounted on the printed circuit board and coupled to the programmable logic device.

12. A method of reducing power in a programmable logic device, the programmable logic device comprising first operational circuitry, second operational circuitry, routing driver circuitry coupled to an output signal of the first operational circuitry, routing receiver circuitry coupled to an input of the second operational circuitry, and an interconnection conductor extending from the routing driver circuitry to the routing receiver circuitry, the method comprising:
    driving a routing signal from the routing driver circuitry onto the interconnection conductor, wherein the voltage swing of the routing signal is less than the voltage swing of the output signal of the first operational circuitry, wherein the routing receiver circuitry is configured to receive the routing signal from the interconnection conductor and to provide an input signal to the input of the second operational circuitry, and wherein at least one condition from the group consisting of the following is true: 1) the routing receiver circuitry comprises a full latch coupled to an inverter, and 2) the routing receiver circuitry comprises a low leakage input buffer coupled to an inverter.

13. The method of claim 12, wherein the voltage swing of the output signal of the first operational circuitry is defined by a first low signal and a first high signal, wherein the voltage swing of the routing signal is defined by a second low signal and a second high signal, and wherein at least one condition from the group consisting of the following is true: 1) the second low signal is higher than the first low signal, and 2) the second high signal is lower than the first high signal.

14. The method of claim 13, wherein the routing driver circuitry comprises a PMOS transistor coupled to an NMOS transistor.

15. The method of claim 14, wherein the driving the routing signal comprises providing the output signal of the first operational circuitry to a gate of the PMOS transistor and a gate of the NMOS transistor.

16. The method of claim 15, wherein one condition from the group consisting of the following is true: 1) when the output signal of the first operational circuitry is defined by the first low signal, the driving the routing signal further comprises the PMOS transistor driving the second low signal onto the interconnection conductor as the routing signal, and 2) when the output signal of the first operational circuitry is defined by the first high signal, the driving the routing signal further comprises the NMOS transistor driving the second high signal onto the interconnection conductor as the routing signal.

17. The method of claim 13, wherein the voltage swing of the input signal to the second operational circuitry is defined by a third low signal and a third high signal, and wherein at least one condition from the group consisting of the following is true: 1) the second low signal is higher than the third low signal, and 2) the second high signal is lower than the third high signal.

18. The method of claim 17, wherein the routing receiver circuitry further comprises a pull-up circuit.

* * * * *